(12) United States Patent
Carpenter et al.

(10) Patent No.: US 7,387,685 B2
(45) Date of Patent: *Jun. 17, 2008

(54) APPARATUS AND METHOD FOR DEPOSITING MATERIALS ONTO MICROELECTRONIC WORKPIECES

(75) Inventors: Craig M. Carpenter, Boise, ID (US); Allen P. Mardian, Boise, ID (US); Ross S. Dando, Nampa, ID (US); Kimberly R. Tschepen, Boise, ID (US); Garo J. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 159 days.

This patent is subject to a terminal disclaimer.

(21) Appl. No.: 10/933,604

(22) Filed: Sep. 2, 2004

(65) Prior Publication Data

US 2005/0133161 A1 Jun. 23, 2005

Related U.S. Application Data

(63) Continuation of application No. 10/191,889, filed on Jul. 8, 2002, now Pat. No. 6,821,347.

(51) Int. Cl.
*C23C 16/455* (2006.01)
*C23C 16/00* (2006.01)
*H01L 21/3065* (2006.01)

(52) U.S. Cl. .............. 118/715; 156/345.34; 156/345.33

(58) Field of Classification Search ............... 118/715; 156/345.33, 345.34
See application file for complete search history.

(56) References Cited

U.S. PATENT DOCUMENTS 579,269 A 3/1897 Hent

| 2,508,500 | A | 5/1950 | de Lange |
| 3,522,836 | A | 8/1970 | King |
| 3,618,919 | A | 11/1971 | Beck |
| 3,620,934 | A | 11/1971 | Endle |

(Continued)

FOREIGN PATENT DOCUMENTS

DE 19851824 5/2000

(Continued)

OTHER PUBLICATIONS

UC Berkeley Extension, Engineering, "Atomic Layer Deposition," Dec. 11, 2001, 5 pages, <http://www.unex.berkeley.edu/eng/br335/1-1.html>.

(Continued)

*Primary Examiner*—Jeffrie R Lund
(74) *Attorney, Agent, or Firm*—Perkins Coie LLP

(57) ABSTRACT

Reactors for vapor deposition of materials onto a microelectronic workpiece, systems that include such reactors, and methods for depositing materials onto microelectronic workpieces. In one embodiment, a reactor for vapor deposition of a material comprises a reaction chamber and a gas distributor. The reaction chamber can include an inlet and an outlet. The gas distributor is positioned in the reaction chamber. The gas distributor has a compartment coupled to the inlet to receive a gas flow and a distributor plate including a first surface facing the compartment, a second surface facing the reaction chamber, and a plurality of passageways. The passageways extend through the distributor plate from the first surface to the second surface. Additionally, at least one of the passageways has at least a partially occluded flow path through the plate. For example, the occluded passageway can be canted at an oblique angle relative to the first surface of the distributor plate so that gas flowing through the canted passageway changes direction as it passes through the distributor plate.

16 Claims, 5 Drawing Sheets

U.S. PATENT DOCUMENTS

| | | |
|---|---|---|
| 3,630,769 A | 12/1971 | Hart et al. |
| 3,630,881 A | 12/1971 | Lester |
| 3,634,212 A | 1/1972 | Valayll et al. |
| 4,018,949 A | 4/1977 | Donakowski et al. |
| 4,242,182 A | 12/1980 | Popescu et al. |
| 4,269,625 A | 5/1981 | Molenaar et al. |
| 4,289,061 A | 9/1981 | Emmett |
| 4,313,783 A | 2/1982 | Davies et al. |
| 4,388,342 A | 6/1983 | Suzuki et al. |
| 4,397,753 A | 8/1983 | Czaja |
| 4,436,674 A | 3/1984 | McMenamin |
| 4,438,724 A | 3/1984 | Doehler et al. |
| 4,469,801 A | 9/1984 | Hiral et al. |
| 4,509,456 A | 4/1985 | Kleinert et al. |
| 4,545,136 A | 10/1985 | Izu et al. |
| 4,590,042 A | 5/1986 | Drage |
| 4,593,644 A | 6/1986 | Hanak |
| 4,681,777 A | 7/1987 | Engelken et al. |
| 4,826,579 A | 5/1989 | Westfall |
| 4,871,417 A | 10/1989 | Nishizawa et al. |
| 4,894,132 A | 1/1990 | Tanaka et al. |
| 4,911,638 A | 3/1990 | Bayne et al. |
| 4,923,715 A | 5/1990 | Matsuda et al. |
| 4,948,979 A | 8/1990 | Munakata et al. |
| 4,949,669 A | 8/1990 | Ishii et al. |
| 4,966,646 A | 10/1990 | Zdeblick |
| 4,977,106 A | 12/1990 | Smith |
| 5,015,330 A | 5/1991 | Okumura et al. |
| 5,017,404 A | 5/1991 | Paquet et al. |
| 5,020,476 A | 6/1991 | Bay et al. |
| 5,062,446 A | 11/1991 | Anderson |
| 5,076,205 A | 12/1991 | Vowles et al. |
| 5,090,985 A | 2/1992 | Soubeyrand |
| 5,091,207 A | 2/1992 | Tanaka et al. |
| 5,131,752 A | 7/1992 | Yu et al. |
| 5,136,975 A | 8/1992 | Bartholomew et al. |
| 5,172,849 A | 12/1992 | Barten et al. |
| 5,200,023 A | 4/1993 | Gifford et al. |
| 5,223,113 A | 6/1993 | Kaneko et al. |
| 5,232,749 A | 8/1993 | Gilton |
| 5,248,527 A | 9/1993 | Uchida et al. |
| 5,286,296 A | 2/1994 | Sato et al. |
| 5,325,020 A | 6/1994 | Campbell et al. |
| 5,364,219 A | 11/1994 | Takahashi et al. |
| 5,366,557 A | 11/1994 | Yu |
| 5,377,429 A | 1/1995 | Sandhu et al. |
| 5,380,396 A | 1/1995 | Shikida et al. |
| 5,409,129 A | 4/1995 | Tsukada et al. |
| 5,418,180 A | 5/1995 | Brown |
| 5,427,666 A | 6/1995 | Mueller et al. |
| 5,433,787 A | 7/1995 | Suzuki et al. |
| 5,433,835 A | 7/1995 | Demaray et al. |
| 5,445,491 A | 8/1995 | Nakagawa et al. |
| 5,453,124 A | 9/1995 | Moslehi et al. |
| 5,480,818 A | 1/1996 | Matsumoto et al. |
| 5,496,410 A | 3/1996 | Fukuda et al. |
| 5,498,292 A | 3/1996 | Ozaki et al. |
| 5,500,256 A | 3/1996 | Watabe et al. |
| 5,522,934 A | 6/1996 | Suzuki et al. |
| 5,536,317 A | 7/1996 | Crain et al. |
| 5,562,800 A | 10/1996 | Kawamura et al. |
| 5,575,883 A | 11/1996 | Nishikawa et al. |
| 5,589,002 A | 12/1996 | Su |
| 5,589,110 A | 12/1996 | Motoda et al. |
| 5,592,581 A | 1/1997 | Okase et al. |
| 5,595,606 A | 1/1997 | Fujikawa et al. |
| 5,599,513 A | 2/1997 | Masaki et al. |
| 5,624,498 A | 4/1997 | Lee et al. |
| 5,626,936 A | 5/1997 | Alderman |
| 5,640,751 A | 6/1997 | Faria |
| 5,643,394 A | 7/1997 | Maydan et al. |
| 5,654,589 A | 8/1997 | Huang et al. |
| 5,693,288 A | 12/1997 | Nakamura et al. |
| 5,716,796 A | 2/1998 | Bull et al. |
| 5,729,896 A | 3/1998 | Dalal et al. |
| 5,733,375 A | 3/1998 | Fukuda et al. |
| 5,746,434 A | 5/1998 | Boyd et al. |
| 5,754,297 A | 5/1998 | Nulman |
| 5,766,364 A | 6/1998 | Ishida et al. |
| 5,769,950 A | 6/1998 | Takasu et al. |
| 5,769,952 A | 6/1998 | Komino et al. |
| 5,788,778 A | 8/1998 | Shang et al. |
| 5,792,269 A | 8/1998 | Deacon et al. |
| 5,792,700 A | 8/1998 | Turner et al. |
| 5,803,938 A | 9/1998 | Yamaguchi et al. |
| 5,819,683 A | 10/1998 | Ikeda et al. |
| 5,820,641 A | 10/1998 | Gu et al. |
| 5,827,370 A | 10/1998 | Gu |
| 5,833,888 A | 11/1998 | Arya et al. |
| 5,846,275 A | 12/1998 | Lane et al. |
| 5,846,330 A | 12/1998 | Quirk et al. |
| 5,851,294 A | 12/1998 | Young et al. |
| 5,851,849 A | 12/1998 | Comizzoli et al. |
| 5,865,417 A | 2/1999 | Harris et al. |
| 5,866,986 A | 2/1999 | Pennington |
| 5,868,159 A | 2/1999 | Loan et al. |
| 5,879,459 A | 3/1999 | Gadgil et al. |
| 5,885,425 A | 3/1999 | Hsieh et al. |
| 5,895,530 A | 4/1999 | Shrotriya et al. |
| 5,902,403 A | 5/1999 | Aitani et al. |
| 5,908,947 A | 6/1999 | Vaartstra |
| 5,911,238 A | 6/1999 | Bump et al. |
| 5,932,286 A | 8/1999 | Beinglass et al. |
| 5,940,684 A | 8/1999 | Shakuda et al. |
| 5,953,634 A | 9/1999 | Kajita et al. |
| 5,956,613 A | 9/1999 | Zhao et al. |
| 5,958,140 A | 9/1999 | Arami et al. |
| 5,961,775 A | 10/1999 | Fujimura et al. |
| 5,968,587 A | 10/1999 | Frankel |
| 5,972,430 A | 10/1999 | DiMeo, Jr. et al. |
| 5,994,181 A | 11/1999 | Hsieh et al. |
| 5,997,588 A | 12/1999 | Goodwin et al. |
| 5,998,932 A | 12/1999 | Lenz |
| 6,006,694 A | 12/1999 | DeOrnellas et al. |
| 6,008,086 A | 12/1999 | Schuegraf et al. |
| 6,016,611 A | 1/2000 | White et al. |
| 6,022,483 A | 2/2000 | Aral |
| 6,032,923 A | 3/2000 | Biegelsen et al. |
| 6,039,557 A | 3/2000 | Unger et al. |
| 6,042,652 A | 3/2000 | Hyun et al. |
| 6,045,620 A | 4/2000 | Tepman et al. |
| 6,059,885 A | 5/2000 | Ohashi et al. |
| 6,062,256 A | 5/2000 | Miller et al. |
| 6,070,551 A | 6/2000 | Li et al. |
| 6,079,426 A | 6/2000 | Subrahmanyam et al. |
| 6,080,446 A | 6/2000 | Tobe et al. |
| 6,086,677 A | 7/2000 | Umotoy et al. |
| 6,089,543 A | 7/2000 | Freerks |
| 6,090,210 A | 7/2000 | Ballance et al. |
| 6,109,206 A | 8/2000 | Maydan et al. |
| 6,113,698 A | 9/2000 | Raaijmakers et al. |
| 6,123,107 A | 9/2000 | Selser et al. |
| 6,129,331 A | 10/2000 | Henning et al. |
| 6,139,700 A | 10/2000 | Kang et al. |
| 6,142,163 A | 11/2000 | McMillin et al. |
| 6,143,077 A | 11/2000 | Ikeda et al. |
| 6,143,078 A | 11/2000 | Ishikawa et al. |
| 6,143,659 A | 11/2000 | Leem |
| 6,144,060 A | 11/2000 | Park et al. |
| 6,149,123 A | 11/2000 | Harris et al. |
| 6,159,297 A * | 12/2000 | Herchen et al. ............ 118/708 |
| 6,159,298 A | 12/2000 | Saito et al. |
| 6,160,243 A | 12/2000 | Cozad |
| 6,161,500 A | 12/2000 | Kopacz et al. |

| Patent | Kind | Date | Inventor |
|---|---|---|---|
| 6,173,673 | B1 | 1/2001 | Golovato et al. |
| 6,174,366 | B1 | 1/2001 | Ihantola et al. |
| 6,174,377 | B1 | 1/2001 | Doering et al. |
| 6,174,809 | B1 | 1/2001 | Kang et al. |
| 6,178,660 | B1 | 1/2001 | Emmi et al. |
| 6,182,603 | B1 | 2/2001 | Shang et al. |
| 6,183,563 | B1 | 2/2001 | Choi et al. |
| 6,190,459 | B1 | 2/2001 | Takeshita et al. |
| 6,192,827 | B1 | 2/2001 | Welch et al. |
| 6,193,802 | B1 | 2/2001 | Pang et al. |
| 6,194,628 | B1 | 2/2001 | Pang et al. |
| 6,197,119 | B1 | 3/2001 | Dozoretz et al. |
| 6,200,415 | B1 | 3/2001 | Maraschin |
| 6,203,613 | B1 | 3/2001 | Gates et al. |
| 6,206,967 | B1 | 3/2001 | Mak et al. |
| 6,206,972 | B1 | 3/2001 | Dunham |
| 6,207,937 | B1 | 3/2001 | Stoddard et al. |
| 6,210,754 | B1 | 4/2001 | Lu et al. |
| 6,211,033 | B1 | 4/2001 | Sandhu et al. |
| 6,211,078 | B1 | 4/2001 | Mathews |
| 6,214,714 | B1 | 4/2001 | Wang et al. |
| 6,237,394 | B1 | 5/2001 | Harris et al. |
| 6,237,529 | B1 | 5/2001 | Spahn |
| 6,245,192 | B1 | 6/2001 | Dhindsa et al. |
| 6,251,190 | B1 | 6/2001 | Mak et al. |
| 6,255,222 | B1 | 7/2001 | Xia et al. |
| 6,263,829 | B1 | 7/2001 | Schneider et al. |
| 6,264,788 | B1 | 7/2001 | Tomoyasu et al. |
| 6,270,572 | B1 | 8/2001 | Kim et al. |
| 6,273,954 | B2 | 8/2001 | Nishikawa et al. |
| 6,277,757 | B1 | 8/2001 | Lin et al. |
| 6,277,763 | B1 | 8/2001 | Kugimiya et al. |
| 6,280,584 | B1 | 8/2001 | Kumar et al. |
| 6,287,965 | B1 | 9/2001 | Kang et al. |
| 6,287,980 | B1 | 9/2001 | Hanazaki et al. |
| 6,290,491 | B1 | 9/2001 | Shahvandi et al. |
| 6,291,337 | B1 | 9/2001 | Sidhwa |
| 6,294,394 | B1 | 9/2001 | Erickson et al. |
| 6,297,539 | B1 | 10/2001 | Ma et al. |
| 6,302,964 | B1 | 10/2001 | Umotoy et al. |
| 6,302,965 | B1 | 10/2001 | Umotoy et al. |
| 6,303,953 | B1 | 10/2001 | Doan et al. |
| 6,305,314 | B1 | 10/2001 | Sneh et al. |
| 6,309,161 | B1 | 10/2001 | Hofmeister |
| 6,315,859 | B1 | 11/2001 | Donohoe |
| 6,321,680 | B2 | 11/2001 | Cook et al. |
| 6,328,803 | B2 | 12/2001 | Rolfson et al. |
| 6,329,297 | B1 | 12/2001 | Balish et al. |
| 6,333,272 | B1 | 12/2001 | McMillin et al. |
| 6,334,928 | B1 | 1/2002 | Sekine et al. |
| 6,342,277 | B1 | 1/2002 | Sherman |
| 6,346,477 | B1 | 2/2002 | Kaloyeros et al. |
| 6,347,602 | B2 | 2/2002 | Goto et al. |
| 6,347,918 | B1 | 2/2002 | Blahnik |
| 6,355,561 | B1 | 3/2002 | Sandhu et al. |
| 6,358,323 | B1 | 3/2002 | Schmitt et al. |
| 6,364,219 | B1 | 4/2002 | Zimmerman et al. |
| 6,374,831 | B1 | 4/2002 | Chandran et al. |
| 6,383,300 | B1 | 5/2002 | Saito et al. |
| 6,387,185 | B2 | 5/2002 | Doering et al. |
| 6,387,207 | B1 | 5/2002 | Janakiraman et al. |
| 6,402,806 | B1 | 6/2002 | Schmitt et al. |
| 6,402,849 | B2 | 6/2002 | Kwag et al. |
| 6,415,736 | B1 | 7/2002 | Hao et al. |
| 6,419,462 | B1 | 7/2002 | Horie et al. |
| 6,420,230 | B1 | 7/2002 | Derderian et al. |
| 6,420,742 | B1 | 7/2002 | Ahn et al. |
| 6,425,168 | B1 | 7/2002 | Takaku et al. |
| 6,428,859 | B1 | 8/2002 | Chiang et al. |
| 6,432,256 | B1 | 8/2002 | Raoux |
| 6,432,259 | B1 | 8/2002 | Noorbakhsh et al. |
| 6,432,831 | B2 | 8/2002 | Dhindsa et al. |
| 6,435,865 | B1 | 8/2002 | Tseng et al. |
| 6,444,039 | B1 | 9/2002 | Nguyen |
| 6,450,117 | B1 | 9/2002 | Murugesh et al. |
| 6,451,119 | B2 | 9/2002 | Sneh et al. |
| 6,458,416 | B1 | 10/2002 | Derderian et al. |
| 6,461,436 | B1 | 10/2002 | Campbell et al. |
| 6,461,931 | B1 | 10/2002 | Eldridge |
| 6,474,700 | B2 | 11/2002 | Redemann et al. |
| 6,503,330 | B1 | 1/2003 | Sneh et al. |
| 6,506,254 | B1 | 1/2003 | Bosch et al. |
| 6,507,007 | B2 | 1/2003 | Van Bilsen |
| 6,508,268 | B1 | 1/2003 | Kouketsu et al. |
| 6,509,280 | B2 | 1/2003 | Choi |
| 6,534,007 | B1 | 3/2003 | Blonigan et al. |
| 6,534,395 | B2 | 3/2003 | Werkhoven et al. |
| 6,540,838 | B2 | 4/2003 | Sneh et al. |
| 6,541,353 | B1 | 4/2003 | Sandhu et al. |
| 6,551,929 | B1 | 4/2003 | Kori et al. |
| 6,562,140 | B1 | 5/2003 | Bondestam et al. |
| 6,562,141 | B2 | 5/2003 | Clarke |
| 6,573,184 | B2 | 6/2003 | Park |
| 6,579,372 | B2 | 6/2003 | Park |
| 6,579,374 | B2 | 6/2003 | Bondestam et al. |
| 6,580,174 | B2 | 6/2003 | McCormick et al. |
| 6,585,823 | B1 | 7/2003 | Van Wijck |
| 6,589,868 | B2 | 7/2003 | Rossman |
| 6,593,644 | B2 | 7/2003 | Chiu et al. |
| 6,596,085 | B1 | 7/2003 | Schmitt et al. |
| 6,602,346 | B1 | 8/2003 | Gochberg et al. |
| 6,613,656 | B2 | 9/2003 | Li |
| 6,622,104 | B2 | 9/2003 | Wang et al. |
| 6,630,201 | B2 | 10/2003 | Chiang et al. |
| 6,635,965 | B1 | 10/2003 | Lee et al. |
| 6,638,672 | B2 | 10/2003 | Deguchi et al. |
| 6,638,879 | B2 | 10/2003 | Hsieh et al. |
| 6,641,673 | B2 | 11/2003 | Yang |
| 6,663,713 | B1 | 12/2003 | Robles et al. |
| 6,666,982 | B2 | 12/2003 | Brcka |
| 6,673,196 | B1 | 1/2004 | Oyabu et al. |
| 6,689,220 | B1 | 2/2004 | Nguyen |
| 6,704,913 | B2 | 3/2004 | Rossman |
| 6,705,345 | B1 | 3/2004 | Bifano |
| 6,706,334 | B1 | 3/2004 | Kobayashi et al. |
| 6,734,020 | B2 | 5/2004 | Lu et al. |
| 6,770,145 | B2 | 8/2004 | Saito et al. |
| 6,787,463 | B2 | 9/2004 | Mardian et al. |
| 6,800,139 | B1 | 10/2004 | Shinriki et al. |
| 6,807,971 | B2 | 10/2004 | Saito et al. |
| 6,814,813 | B2 | 11/2004 | Dando et al. |
| 6,818,249 | B2 | 11/2004 | Derderian |
| 6,821,347 | B2 | 11/2004 | Carpenter et al. |
| 6,828,218 | B2 | 12/2004 | Kim et al. |
| 6,830,652 | B1 | 12/2004 | Ohmi et al. |
| 6,831,315 | B2 | 12/2004 | Raaijmakers et al. |
| 6,838,114 | B2 | 1/2005 | Carpenter et al. |
| 6,845,734 | B2 | 1/2005 | Carpenter et al. |
| 6,849,131 | B2 | 2/2005 | Chen et al. |
| 6,858,264 | B2 | 2/2005 | Dando et al. |
| 6,861,094 | B2 | 3/2005 | Derderian et al. |
| 6,861,356 | B2 | 3/2005 | Matsuse et al. |
| 6,869,500 | B2 | 3/2005 | Lee et al. |
| 6,881,295 | B2 | 4/2005 | Nagakura et al. |
| 6,884,296 | B2 | 4/2005 | Basceri et al. |
| 6,887,521 | B2 | 5/2005 | Basceri |
| 6,890,386 | B2 | 5/2005 | DeDontney et al. |
| 6,905,547 | B1 | 6/2005 | Londergan et al. |
| 6,905,549 | B2 | 6/2005 | Okuda et al. |
| 6,926,775 | B2 | 8/2005 | Carpenter et al. |
| 6,955,725 | B2 | 10/2005 | Dando |
| 6,966,936 | B2 | 11/2005 | Yamasaki et al. |
| 6,991,684 | B2 | 1/2006 | Kannan et al. |
| 7,022,184 | B2 | 4/2006 | Van Wijck et al. |
| 7,056,806 | B2 | 6/2006 | Basceri et al. |
| 7,086,410 | B2 | 8/2006 | Chouno et al. |

| | | |
|---|---|---|
| 2001/0001952 A1 | 5/2001 | Nishizawa et al. |
| 2001/0011526 A1 | 8/2001 | Doering et al. |
| 2001/0012697 A1 | 8/2001 | Mikata |
| 2001/0045187 A1 | 11/2001 | Uhlenbrock |
| 2001/0050267 A1 | 12/2001 | Hwang et al. |
| 2001/0054484 A1 | 12/2001 | Komino |
| 2002/0000202 A1 | 1/2002 | Yuda et al. |
| 2002/0007790 A1 | 1/2002 | Park |
| 2002/0042205 A1 | 4/2002 | McMillin et al. |
| 2002/0043216 A1 | 4/2002 | Hwang et al. |
| 2002/0052097 A1 | 5/2002 | Park |
| 2002/0073924 A1 | 6/2002 | Chiang et al. |
| 2002/0076490 A1 | 6/2002 | Chiang et al. |
| 2002/0076507 A1 | 6/2002 | Chiang et al. |
| 2002/0076508 A1 | 6/2002 | Chiang et al. |
| 2002/0094689 A1 | 7/2002 | Park |
| 2002/0100418 A1 | 8/2002 | Sandhu et al. |
| 2002/0104481 A1 | 8/2002 | Chiang et al. |
| 2002/0108714 A1 | 8/2002 | Doering et al. |
| 2002/0127745 A1 | 9/2002 | Lu et al. |
| 2002/0129768 A1 | 9/2002 | Carpenter et al. |
| 2002/0132374 A1 | 9/2002 | Basceri et al. |
| 2002/0144655 A1 | 10/2002 | Chiang et al. |
| 2002/0162506 A1 | 11/2002 | Sneh et al. |
| 2002/0164420 A1 | 11/2002 | Derderian et al. |
| 2002/0185067 A1 | 12/2002 | Upham |
| 2002/0195056 A1 | 12/2002 | Sandhu et al. |
| 2002/0195145 A1 | 12/2002 | Lowery et al. |
| 2002/0195201 A1 | 12/2002 | Beer et al. |
| 2002/0197402 A1 | 12/2002 | Chiang et al. |
| 2003/0000473 A1 | 1/2003 | Chae et al. |
| 2003/0003697 A1 | 1/2003 | Agarwal et al. |
| 2003/0003730 A1 | 1/2003 | Li |
| 2003/0023338 A1 | 1/2003 | Chin et al. |
| 2003/0024477 A1 | 2/2003 | Okuda et al. |
| 2003/0027428 A1 | 2/2003 | Ng et al. |
| 2003/0027431 A1 | 2/2003 | Sneh et al. |
| 2003/0031794 A1 | 2/2003 | Tada et al. |
| 2003/0049372 A1 | 3/2003 | Cook et al. |
| 2003/0066483 A1 | 4/2003 | Lee et al. |
| 2003/0070609 A1 | 4/2003 | Campbell et al. |
| 2003/0070617 A1 | 4/2003 | Kim et al. |
| 2003/0070618 A1 | 4/2003 | Campbell et al. |
| 2003/0075273 A1 | 4/2003 | Kilpela et al. |
| 2003/0079686 A1 | 5/2003 | Chen et al. |
| 2003/0094903 A1* | 5/2003 | Tao et al. ............... 315/111.91 |
| 2003/0098372 A1 | 5/2003 | Kim |
| 2003/0098419 A1 | 5/2003 | Ji et al. |
| 2003/0106490 A1 | 6/2003 | Jallepally et al. |
| 2003/0121608 A1 | 7/2003 | Chen et al. |
| 2003/0192645 A1 | 10/2003 | Liu et al. |
| 2003/0213435 A1 | 11/2003 | Okuda et al. |
| 2004/0000270 A1 | 1/2004 | Carpenter et al. |
| 2004/0003777 A1 | 1/2004 | Carpenter et al. |
| 2004/0007188 A1 | 1/2004 | Burkart et al. |
| 2004/0025786 A1 | 2/2004 | Kontani et al. |
| 2004/0040502 A1 | 3/2004 | Basceri et al. |
| 2004/0040503 A1 | 3/2004 | Basceri et al. |
| 2004/0083959 A1 | 5/2004 | Carpenter et al. |
| 2004/0083961 A1 | 5/2004 | Basceri |
| 2004/0089240 A1 | 5/2004 | Dando et al. |
| 2004/0099377 A1 | 5/2004 | Newton et al. |
| 2004/0124131 A1 | 7/2004 | Aitchison et al. |
| 2004/0226507 A1 | 11/2004 | Carpenter et al. |
| 2004/0226516 A1 | 11/2004 | Daniel et al. |
| 2004/0238123 A1 | 12/2004 | Becknell et al. |
| 2005/0016956 A1 | 1/2005 | Liu et al. |
| 2005/0016984 A1 | 1/2005 | Dando |
| 2005/0022739 A1 | 2/2005 | Carpenter et al. |
| 2005/0028734 A1 | 2/2005 | Carpenter et al. |
| 2005/0039680 A1 | 2/2005 | Beaman et al. |
| 2005/0039686 A1 | 2/2005 | Zheng et al. |
| 2005/0045100 A1 | 3/2005 | Derderian |
| 2005/0045102 A1 | 3/2005 | Zheng et al. |
| 2005/0048742 A1 | 3/2005 | Dip et al. |
| 2005/0059261 A1 | 3/2005 | Basceri et al. |
| 2005/0061243 A1 | 3/2005 | Sarigiannis et al. |
| 2005/0081786 A1 | 4/2005 | Kubista et al. |
| 2005/0087130 A1 | 4/2005 | Derderian |
| 2005/0087132 A1 | 4/2005 | Dickey et al. |
| 2005/0087302 A1 | 4/2005 | Mardian et al. |
| 2005/0120954 A1 | 6/2005 | Carpenter et al. |
| 2005/0126489 A1 | 6/2005 | Beaman et al. |
| 2005/0133161 A1* | 6/2005 | Carpenter et al. ..... 156/345.34 |
| 2005/0145337 A1 | 7/2005 | Derderian et al. |
| 2005/0164466 A1 | 7/2005 | Zheng et al. |
| 2005/0217575 A1 | 10/2005 | Gealy et al. |
| 2005/0217582 A1 | 10/2005 | Kim et al. |
| 2005/0249873 A1 | 11/2005 | Sarigiannis et al. |
| 2005/0249887 A1 | 11/2005 | Dando et al. |
| 2005/0268856 A1 | 12/2005 | Miller et al. |
| 2006/0115957 A1 | 6/2006 | Basceri et al. |
| 2006/0121689 A1 | 6/2006 | Basceri et al. |
| 2006/0134345 A1 | 6/2006 | Rueger et al. |
| 2006/0165873 A1 | 7/2006 | Rueger et al. |
| 2006/0198955 A1 | 9/2006 | Zheng et al. |
| 2006/0204649 A1 | 9/2006 | Beaman et al. |
| 2006/0205187 A1 | 9/2006 | Zheng et al. |
| 2006/0213440 A1 | 9/2006 | Zheng et al. |
| 2006/0237138 A1 | 10/2006 | Qin |

FOREIGN PATENT DOCUMENTS

| | | |
|---|---|---|
| JP | 4-213818 A | 8/1992 |
| JP | 2002-164336 | 6/2002 |
| JP | 2001-254181 | 9/2002 |
| KR | 2005112371 A * | 5/2004 |
| SU | 598630 | 2/1978 |
| WO | WO 99/06610 A1 | 2/1999 |
| WO | WO 00/40772 A1 | 7/2000 |
| WO | WO 00/79019 A1 | 12/2000 |
| WO | WO 02/45871 A1 | 6/2002 |
| WO | WO 02/073329 A2 | 9/2002 |
| WO | WO 03/008662 A2 | 1/2003 |
| WO | WO 03/016587 A1 | 2/2003 |
| WO | WO 03/033762 A1 | 4/2003 |
| WO | WO 03/035927 A2 | 5/2003 |

OTHER PUBLICATIONS

IPS Integrated Process Systems, Dec. 11, 2001, 1 page, <http://www.ips-tech.com/eng/main.htm>.

IPS Integrated Process Systems, Nano-ALD, Dec. 11, 2001, 2 pages, <http://www.ips-tech.com/eng/pro-p2.htm>.

IPS Integrated Process Systems, Nano-ALD, Dec. 11, 2001, 2 pages, <http://www.ips-tech.com/eng/pro-p2-2.htm>.

Deublin Company, Precision Rotating Unions, Steam Joints and Siphon Systems "Precision Rotating Connections for Water, Steam, Air, Hydraulic, Vacuum, Coolant and Hot Oil Service," <http://www.deublin.com>, Feb. 4, 2002, 1 page.

Deublin Company, "Rotating Unions," <http://www.deublin.com/products/rotatingunions.htm>, Feb. 4, 2002 1 page.

Deublin Company, "Sealing," <http://www.deublin.com/products/sealing.htm>, Feb. 4, 2002, 2 pages.

Electronics Times, "Atomic Layer Deposition Chamber Works at Low Temperatures," 2 pages, Dec. 11, 2001, 2001 CMP Europe Ltd., <http://www.electronicstimes.com/story/OEG20010719S0042>.

The University of Adelaide Australia, Department of Chemistry, Stage 2 Chemistry Social Relevance Projects, "Spectroscopy," 2 pages, Feb. 9, 2002, <http://www.chemistry.adelaide.edu.au/external/Soc-Rel/content/Spectros.htm>.

U.S. Appl. No. 09/651,037, filed Aug. 30, 2000, Mardian.

* cited by examiner

APPARATUS AND METHOD FOR DEPOSITING MATERIALS ONTO MICROELECTRONIC WORKPIECES

CROSS-REFERENCE TO RELATED APPLICATION

This application is a continuation of U.S. application Ser. No. 10/191,889, entitled APPARATUS AND METHOD FOR DEPOSITING MATERIALS ONTO MICROELECTRONIC WORKPIECES," filed Jul. 8, 2002 now U.S. Pat. No. 6,821,347, which is incorporated herein by reference in its entirety.

TECHNICAL FIELD

The present invention is related to the field of thin film deposition in the manufacturing of micro-devices.

BACKGROUND

Thin film deposition techniques are widely used in the manufacturing of microelectronic devices to form a coating on a workpiece that closely conforms to the surface topography. The size of the individual components in the devices is constantly decreasing, and the number of layers in the devices is increasing. As a result, the density of components and the aspect ratios of depressions (e.g., the ratio of the depth to the size of the opening) is increasing. The size of workpieces is also increasing to provide more real estate for forming more dies (i.e., chips) on a single workpiece. Many fabricators, for example, are transitioning from 200 mm to 300 mm workpieces, and even larger workpieces will likely be used in the future. Thin film deposition techniques accordingly strive to produce highly uniform conformal layers that cover the sidewalls, bottoms and corners in deep depressions that have very small openings.

One widely used thin film deposition technique is Chemical Vapor Deposition (CVD). In a CVD system, one or more precursors that are capable of reacting to form a solid thin film are mixed in a gas or vapor state, and then the precursor mixture is presented to the surface of the workpiece. The surface of the workpiece catalyzes the reaction between the precursors to form a thin solid film at the workpiece surface. The most common way to catalyze the reaction at the surface of the workpiece is to heat the workpiece to a temperature that causes the reaction.

Although CVD techniques are useful in many applications, they also have several drawbacks. For example, if the precursors are not highly reactive, then a high workpiece temperature is needed to achieve a reasonable deposition rate. Such high temperatures are not typically desirable because heating the workpiece can be detrimental to the structures and other materials that are already formed on the workpiece. Implanted or doped materials, for example, migrate in the silicon substrate when a workpiece is heated. On the other hand, if more reactive precursors are used so that the workpiece temperature can be lower, then reactions may occur prematurely in the gas phase before reaching the substrate. This is not desirable because the film quality and uniformity may suffer, and also because it limits the types of precursors that can be used. Thus, CVD techniques may not be appropriate for many thin film applications.

Atomic Layer Deposition (ALD) is another thin film deposition technique that addresses several of the drawbacks associated with CVD techniques. FIGS. 1A and 1B schematically illustrate the basic operation of ALD processes.

Referring to FIG. 1A, a layer of gas molecules $A_x$ coats the surface of a workpiece W. The layer of $A_x$ molecules is formed by exposing the workpiece W to a precursor gas containing $A_x$ molecules, and then purging the chamber with a purge gas to remove excess $A_x$ molecules. This process can form a monolayer of $A_x$ molecules on the surface of the workpiece W because the $A_x$ molecules at the surface are held in place during the purge cycle by physical adsorption forces at moderate temperatures or chemisorption forces at higher temperatures. The layer of $A_x$ molecules is then exposed to another precursor gas containing $B_y$ molecules. The $A_x$ molecules react with the $B_y$ molecules to form an extremely thin solid layer of material on the workpiece W. The chamber is then purged again with a purge gas to remove excess $B_y$ molecules.

FIG. 2 illustrates the stages of one cycle for forming a thin solid layer using ALD techniques. A typical cycle includes (a) exposing the workpiece to the first precursor $A_x$, (b) purging excess $A_x$ molecules, (c) exposing the workpiece to the second precursor $B_y$, and then (d) purging excess $B_y$ molecules. In actual processing several cycles are repeated to build a thin film on a workpiece having the desired thickness. For example, each cycle may form a layer having a thickness of approximately 0.5-1.0 Å, and thus it takes approximately 60-120 cycles to form a solid layer having a thickness of approximately 60 Å.

FIG. 3 schematically illustrates an ALD reactor 10 having a chamber 20 coupled to a gas supply 30 and a vacuum 40. The reactor 10 also includes a heater 50 that supports the workpiece W and a gas dispenser 60 in the chamber 20. The gas dispenser 60 includes a plenum 62 operatively coupled to the gas supply 30 and a distributor plate 70 having a plurality of holes 72. In operation, the heater 50 heats the workpiece W to a desired temperature, and the gas supply 30 selectively injects the first precursor $A_x$, the purge gas, and the second precursor $B_y$ as shown above in FIG. 2. The vacuum 40 maintains a negative pressure in the chamber to draw the gases from the gas dispenser 60 across the workpiece W and then through an outlet of the chamber 20.

One drawback of ALD processing is that it is difficult to avoid mixing between the first and second precursors in the chamber apart from the surface of the workpiece. For example, a precursor may remain on surfaces of the gas dispenser or on other surfaces of the chamber even after a purge cycle. This results in the unwanted deposition of the solid material on components of the reaction chamber. The first and second precursors may also mix together in a supply line or other area of a reaction chamber to prematurely form solid particles before reaching the surface of the workpiece. Thus, the components of the ALD reactor and the timing of the $A_x$/purge/$B_y$/purge pulses of a cycle should not entrap or otherwise cause mixing of the precursors in a manner that produces unwanted deposits or premature reactions.

Another drawback of ALD processing is that the film thickness may be different at the center of the workpiece than at the periphery. To overcome this problem, the center of some distributor plates do not have any holes 72. In practice, however, this may cause the film at the center of the workpiece to be thinner than the film at the periphery. Moreover, the center portion of such plates may become coated with the solid material because it is difficult to purge all of the precursors from this portion of the gas dispenser 60 during normal purge cycles. Therefore, there is a need to resolve the problem of having a different film thickness at the center of the workpiece than at the periphery.

SUMMARY

The present invention is directed toward reactors for deposition of materials onto a micro-device workpiece, systems that include such reactors, and methods for depositing materials onto micro-device workpieces. In one embodiment, a reactor for depositing a material comprises a reaction chamber and a gas distributor that directs gas flows to a workpiece. The reaction chamber can include an inlet and an outlet, and the gas distributor is positioned in the reaction chamber. The gas distributor has a compartment coupled to the inlet to receive a gas flow and a distributor plate including a first surface facing the compartment, a second surface facing the reaction chamber, and a plurality of passageways. The passageways extend through the distributor plate from the first surface to the second surface. Additionally, at least one of the passageways has at least a partially occluded flow path through the plate. For example, the occluded passageway can be canted at an oblique angle relative to the first surface of the distributor plate so that gas flowing through the canted passageway changes direction as it passes through the distributor plate.

The compartment of the gas distributor can be defined by a sidewall, and the distributor plate can extend transverse relative to the sidewall. In one embodiment, the distributor plate has an inner region, an outer region, and a peripheral edge spaced laterally inward from the sidewall to define a gap between the peripheral edge and the sidewall. In other embodiments, the peripheral edge of the distributor plate can be coupled to the sidewall.

The distributor plate can have several different embodiments. The distributor plate, for example, can have a first plurality of passageways in the inner region that are canted at an oblique angle relative to the first surface of the distributor plate, and a second plurality of passageways in the outer region that are generally normal to the first surface of the distributor plate. In another embodiment, all of the passageways through the distributor plate can be canted at an angle. The size of the passageways can also vary across the distributor plate. In one embodiment, a first plurality of passageways in the inner region have a cross-sectional dimension of approximately 0.01-0.07 inch, and a second plurality of passageways in the outer region have a cross-sectional dimension of approximately 0.08-0.20 inch. In still other embodiments, a first plurality of passageways in the inner region are canted at a first oblique angle relative to the first surface of the distributor plate, and a second plurality of passageways in the outer region are canted at a second oblique angle relative to the first surface of the distributor plate. The canted passageways are generally angled downward and radially outward from the first surface to the second surface to direct the gas flow radially outward across the surface of the workpiece. For example, the canted passageways can extend at an angle of approximately 15 degrees to approximately 85 degrees relative to the first surface of the distributor plate. The passageways, however, can be angled at different angles or canted in different directions in other embodiments.

DETAILED DESCRIPTION

The following disclosure is directed toward reactors for depositing a material onto a micro-device workpiece, systems including such reactors, and methods for depositing a material onto a micro-device workpiece. Many specific details of the invention are described below with reference to depositing materials onto micro-device workpieces. The term "micro-device workpiece" is used throughout to include substrates upon which and/or in which microelectronic devices, micromechanical devices, data storage elements, and other features are fabricated. For example, micro-device workpieces can be semiconductor wafers, glass substrates, insulative substrates, and many other types of materials. The term "gas" is used throughout to include any form of matter that has no fixed shape and will conform in volume to the space available, which specifically includes vapors (i.e., a gas having a temperature less than the critical temperature so that it may be liquified or solidified by compression at a constant temperature). Additionally, several aspects of the invention are described with respect to Atomic Layer Deposition ("ALD"), but certain aspects may be applicable to other types of deposition processes. Several embodiments in accordance with the invention are set forth in FIGS. 4-8 and the related text to provide a thorough understanding of particular embodiments of the invention. A person skilled in the art will understand, however, that the invention may have additional embodiments, or that the invention may be practiced without several of the details in the embodiments shown in FIGS. 4-8.

A. Deposition Systems

Figure 1A:
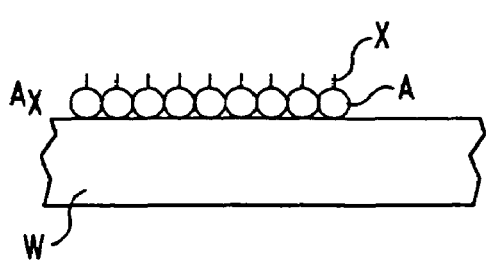
FIGS. 1A and 1B are schematic cross-sectional views of stages in atomic layer deposition processing in accordance with the prior art.
Figure 1B:
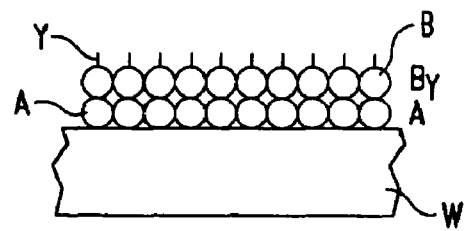
Figure 2:
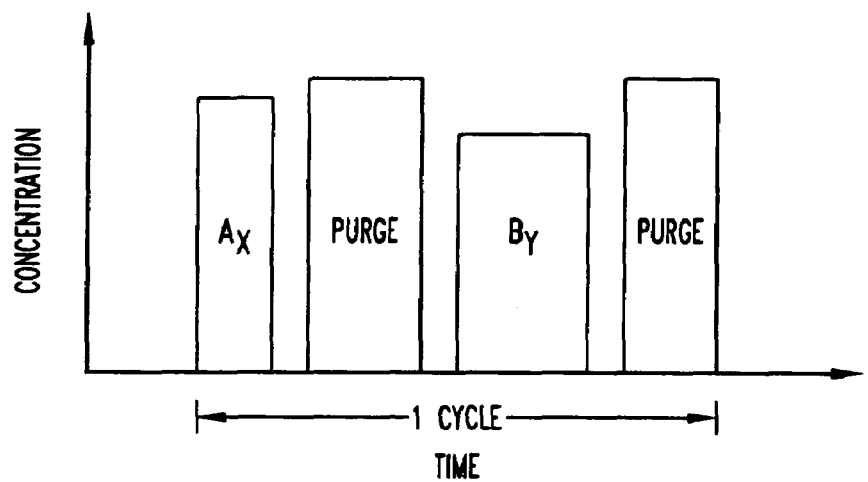
FIG. 2 is a graph illustrating a cycle for forming a layer using atomic layer deposition in accordance with the prior art.
Figure 3:
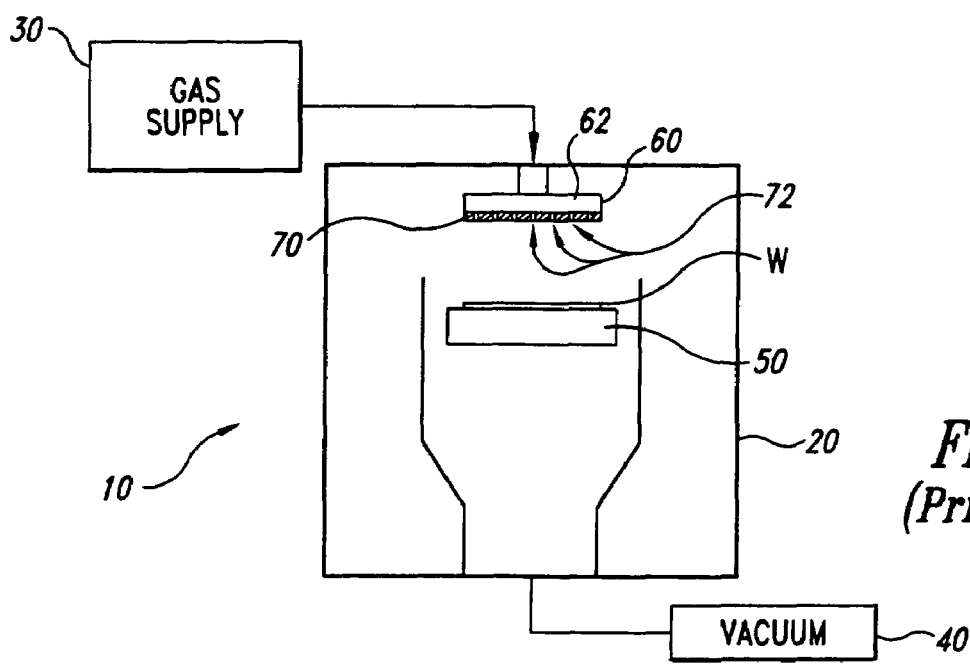
FIG. 3 is a schematic representation of a system including a reactor for vapor deposition of a material onto a microelectronic workpiece in accordance with the prior art.
Figure 4:
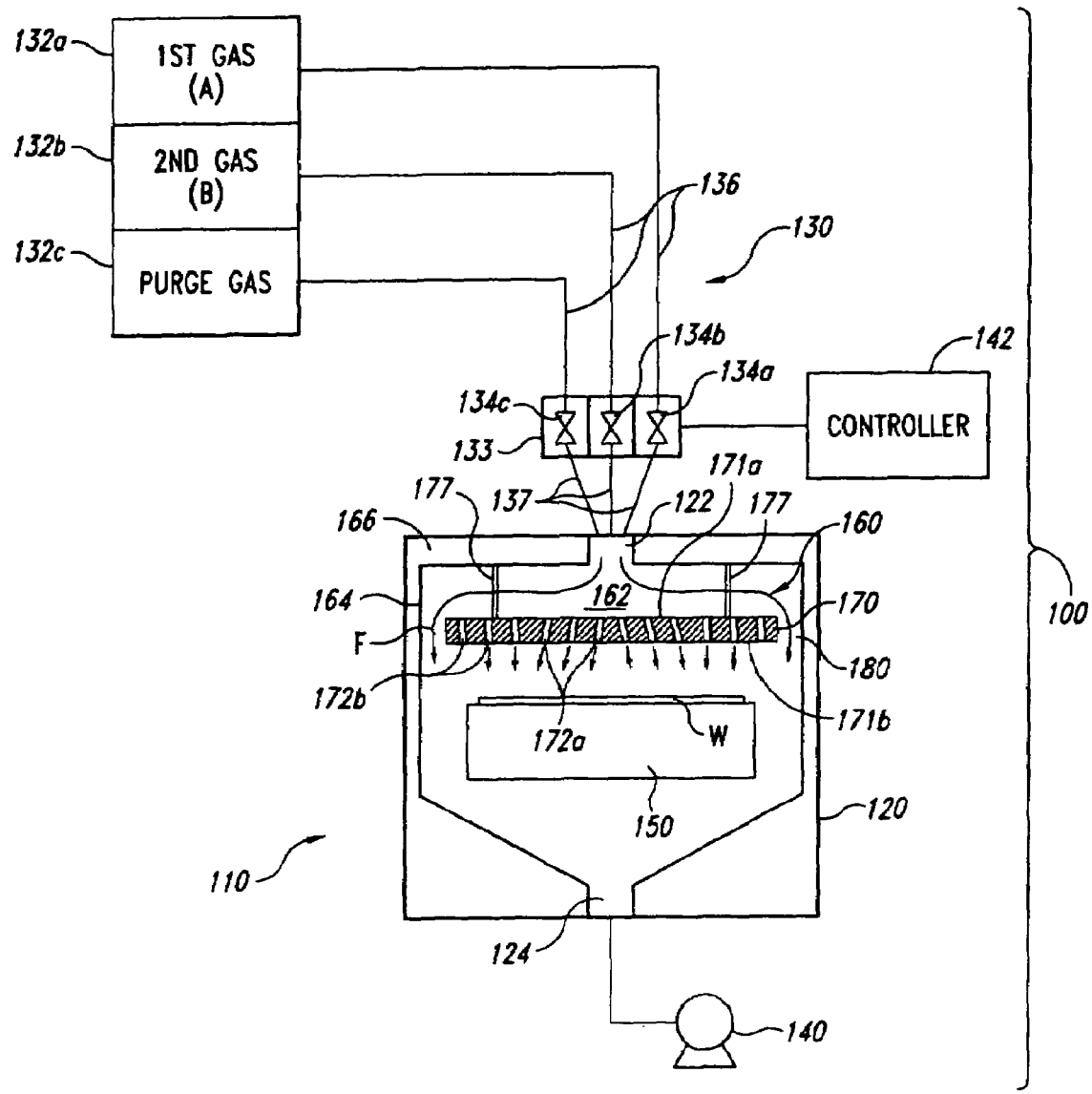
FIG. 4 is a schematic representation of a system having a reactor for depositing a material onto a micro-device workpiece in accordance with one embodiment of the invention.

FIG. 4 is a schematic representation of a system 100 for depositing a material onto a micro-device workpiece W in accordance with an embodiment of the invention. In this embodiment, the system 100 includes a reactor 110 having a reaction chamber 120 coupled to a gas supply 130 and a vacuum 140. For example, the reaction chamber 120 can have an inlet 122 coupled to the gas supply 130 and an outlet 124 coupled to the vacuum 140.

The gas supply 130 includes a plurality of gas sources 132 (identified individually as 132a-c), a valve assembly 133 having a plurality of valves 134 (identified individually as 134a-c), and a plurality of gas lines 136 and 137. The gas sources 132 can include a first gas source 132a for providing a first precursor gas "A," a second gas source 132b for providing a second precursor gas "B," and a third gas source 132c for providing a purge gas P. The first and second precursors A and B can be the constituents that react to form the thin, solid layer on the workpiece W. The p-urge gas P can a type of gas that is compatible with the reaction chamber 120 and the workpiece W. The first gas source 132a is coupled to a first valve 134a, the second gas source 132b is coupled to a second valve 134b, and the third gas source 132c is coupled to a third valve 134c. The valves 134a-c are operated by a controller 142 that generates signals for pulsing the individual gases through the reaction chamber 120 in a number of cycles. Each cycle can include a first pulse of the first precursor A, a second pulse of the purge gas, a third pulse of the second precursor B, and a fourth pulse of the purge gas.

The reactor 110 in the embodiment illustrated in FIG. 4 also includes a workpiece support 150 and a gas distributor 160 in the reaction chamber 120. The workpiece support 150 can be a plate having a heating element to heat the workpiece W to a desired temperature for catalyzing the reaction between the first precursor A and the second precursor B at the surface of the workpiece W. The workpiece support 150, however, may not be heated in all applications.

The gas distributor 160 is positioned at the inlet 122 of the reaction chamber 120. The gas distributor 160 has a compartment or plenum 162 that is defined, at least in part, by a sidewall 164. The compartment or plenum 162 can be further defined by a chamber lid 166. The gas distributor 160 further includes a distributor plate 170 having a first surface 171a facing the compartment 162, a second surface 171b facing away from the compartment 162, and a plurality of passageways 172 (identified by reference numbers 172a and 172b). As explained in more detail below, a gas flow F in the compartment 162 flows through the passageways 172a-b and through a gap 180 between the sidewall 164 and the distributor plate 170. As explained in more detail below, this particular embodiment of the distributor plate 170 performs the following functions: (a) directs the gas flow F to provide a more uniform film thickness across the workpiece W; and (b) limits areas in the reaction chamber where the precursors can adduct and mix prematurely before contacting the workpiece.

B. Gas Distributors and Distributor Plates

Figure 5:
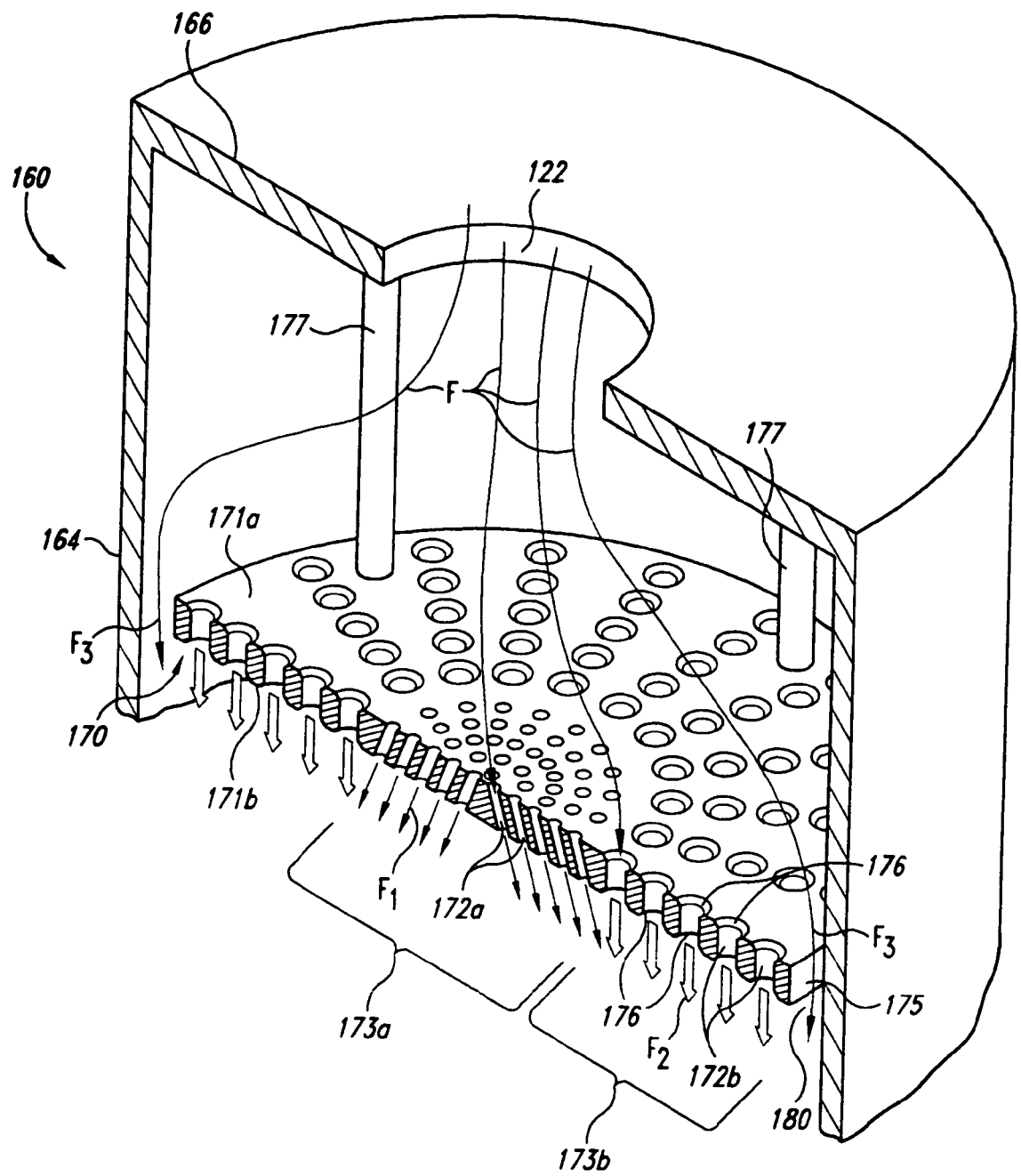
FIG. 5 is an isometric, cross-sectional view illustrating a portion of a reactor for depositing a material onto a micro-device workpiece in accordance with an embodiment of the invention.

FIG. 5 illustrates a particular embodiment of the gas distributor 160 and the distributor plate 170 in greater detail. In this embodiment, the distributor plate 170 has an inner region 173a with a first plurality of passageways 172a and an outer region 173b with a second plurality of passageways 172b. The first passageways 172a extend from the first surface 171a to the second surface 171b, and at least a portion of each of the first passageways 172a is at least partially occluded along a flow path to the plate 170. In this particular embodiment, the first passageways 172a are occluded by being canted at an oblique angle relative to the first surface 171a and/or the plane defined by the plate 170. The term "occluded," as used herein, is not limited to an obstruction that blocks the passageways 172, but rather means that some of the gas molecules flowing through the first passageways 172a cannot flow through the plate 170 along a direct "line-of-sight" between the first surface 171a and the second surface 171b normal to the plane defined by the plate 170. It will be appreciated that canting the first passageways 172a at an oblique angle relative to the plate 170 can either fully or at least partially block the direct line-of-sight to the workpiece while still allowing gas to flow through the first passageways 172a. The first passageways 172a can be canted at an angle of approximately 15° to approximately 85° relative to the plane defined by the plate 170. The second passageways 172b extend through the plate 170 generally normal to the first surface 171a such that they provide a direct line-of-sight to the workpiece throughout the full cross-sectional dimension of the second passageways 172b. The second passageways 172b can also have bevels 176 at the first surface 171a and/or the second surface 171b.

The distributor plate 170 is carried by a number of retainers 177 that are coupled to the lid 166 or another component of the reaction chamber 120. The retainers 177 are brackets, posts, or other suitable devices that can hold the distributor plate 170 relative to the inlet 122 and the sidewall 164. In this embodiment, the distributor plate 170 has a peripheral edge 175 spaced apart from the sidewall 164 by an annular gap 180. In operation, therefore, the gas flow F has a first component $F_1$ that flows through the first passageways 172a, a second component $F_2$ that flows through the second passageways 172b, and a third component $F_3$ that flows through the gap 180. The first passageways 172a direct the first flow component $F_1$ downward and radially outward to prevent over-saturating the center portion of the workpiece with the precursors. The second passageways 172b direct the second flow component $F_2$ downward and generally normal to the plate 170 to provide more gas molecules to an outer region of the workpiece. The gap 180 also provides an enhanced flow of gas at the outer and peripheral regions of the workpiece.

Several embodiments of the distributor plate 170 are accordingly expected to provide more uniform saturation of the workpiece W with the first and second precursors A and B to provide a more uniform layer of material on the workpiece. Additionally, because the inner region 173a of the plate 170 includes the first plurality of passageways 172a, the surface areas upon which the first and second precursors A and B can adduct is reduced compared to conventional plates that do not have any openings in the inner region. This is expected to reduce the build up of the deposited material on the first surface 171a of the distributor plate 170. It is also expected that such a reduction in the surface area will enhance the ability to control the uniformity of the deposited layer and the endpoints of the gas pulses for better quality depositions and enhanced throughput.

The first passageways 172a can also have a different cross-sectional dimension than the second passageways 172b as shown in the particular embodiment illustrated in FIG. 5. The first passageways, for example, can have openings of approximately 0.01-0.07 inch, and the second passageways 172b can have openings of approximately 0.08-0.20 inch. In a particular embodiment, the first passageways 172a at the inner region 173a have a circular opening with a diameter of approximately 0.03 inch, and the second passageways 172b in the outer region 173b have a circular opening with a diameter of approximately 0.10 inch. It will be appreciated that the cross-sectional size of the first and second passageways 172a-b can be the same, or that they can have cross-sectional dimensions that are different than the ranges set forth above.

The passageways 172 can accordingly be configured to further enhance or restrict the gas flow to particular areas of the workpiece by canting, or otherwise occluding selected passageways, and/or varying the sizes of the cross-sectional dimensions of the passageways. In the embodiment shown in FIG. 5, for example, the smaller cross-sectional dimension of the first passageways 172a inhibits gas molecules from contacting the central region of the workpiece W, and the larger cross-sectional dimension of the second passageways 172b enhances the number of gas molecules that contact the outer region of the workpiece. Therefore, the cross-sectional dimensions and the angles of inclination of the passageways can be used either separately or together to provide the desired distribution of gas to the surface of the workpiece.

Figure 6:
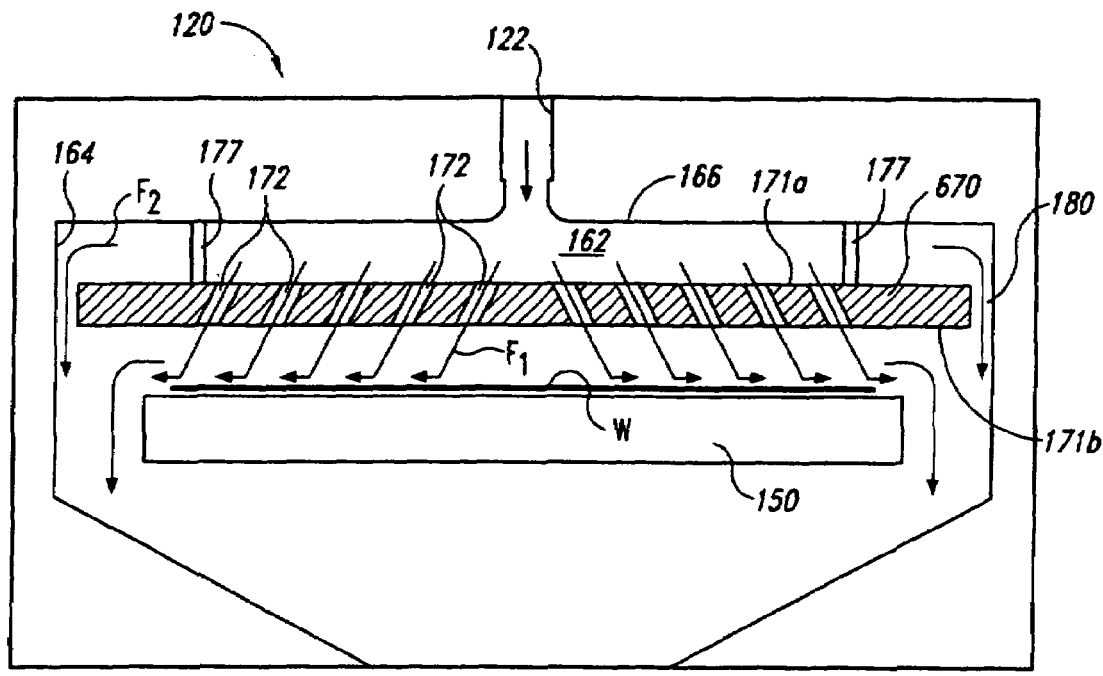
FIG. 6 is a cross-sectional view of a reactor for depositing a material onto a micro-device workpiece in accordance with another embodiment of the invention.

FIG. 6 is a cross-sectional view of a distributor plate 670 in accordance with another embodiment of the invention. Several components of the distributor plate 670 are the same as the distributor plate 170, and thus like reference numbers refer to like components in FIGS. 4-6. The distributor plate 670 can include a plurality of passageways 172 that are canted at an oblique angle relative to the plane defined by the plate 670. In this embodiment, all of the passageways 172 are canted at the same angle. The angle of inclination can be approximately 15 degrees to approximately 85 degrees. In operation, the embodiment of the distributor plate 670 shown in FIG. 6 has a first flow component $F_1$ that flows radially outwardly and downward from the plate 670, and a second flow component $F_2$ that flows through the gap 180. The passageways 172 can have the same cross-sectional dimensions, or they can have different cross-sectional dimensions similar to the plate 170 described above.

Figure 7:
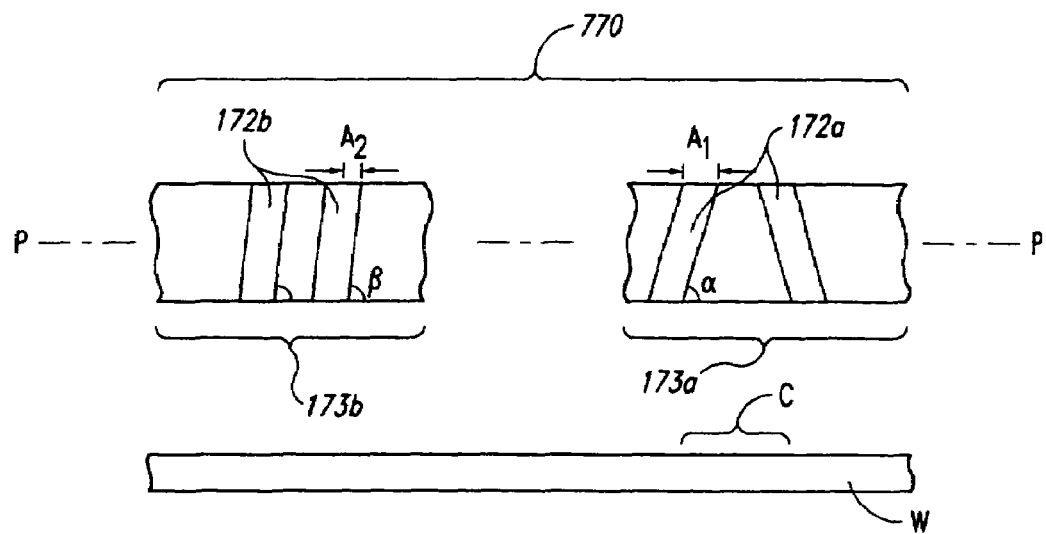
FIG. 7 is a partial cross-sectional view of a distributor plate for use in a reactor for depositing a material onto a micro-device workpiece in accordance with another embodiment of the invention.

FIG. 7 is a partial cross-sectional view of a distributor plate 770 in accordance with another embodiment of the invention. The distributor plate 770 is similar to the distributor plate 170, and thus like reference numbers refer to like components in FIGS. 4, 5 and 7. In this embodiment, the first passageways 172a at the inner region 173a are canted at a first angle α, and the second passageways 172b in the second region 173b are canted at a second angle β. The angle α is generally less than the angle β relative to the plane P-P defined by the plate 770. As such, the first passageways 172a have a first occlusion area $A_1$ in which there is no direct line-of-sight through the plate 770 to the workpiece W along a path normal to the plate 170. The second passageways 172b, however, have a smaller occlusion area $A_2$ because the higher angle β allows gas to pass completely through a portion of the second passageways 172b along a path normal to the plate 770 or the workpiece W. By increasing the size of the occlusion area $A_1$ for the first passageways 172a relative to the occlusion area $A_2$ for the second passageways 172b, fewer gas molecules are likely to be deposited on the central region C of the workpiece W. It will be appreciated that the distributor plate 770 can have variable canting of the passageways 172 from the center to the perimeter of the plate along a continuum or throughout several regions in which the angle of incline increases toward the periphery of the plate 770. Accordingly, in other embodiments, the distributor plate 770 can have more than two regions in which the passageways are canted at different angles.

C. Additional Deposition Systems

Figure 8:
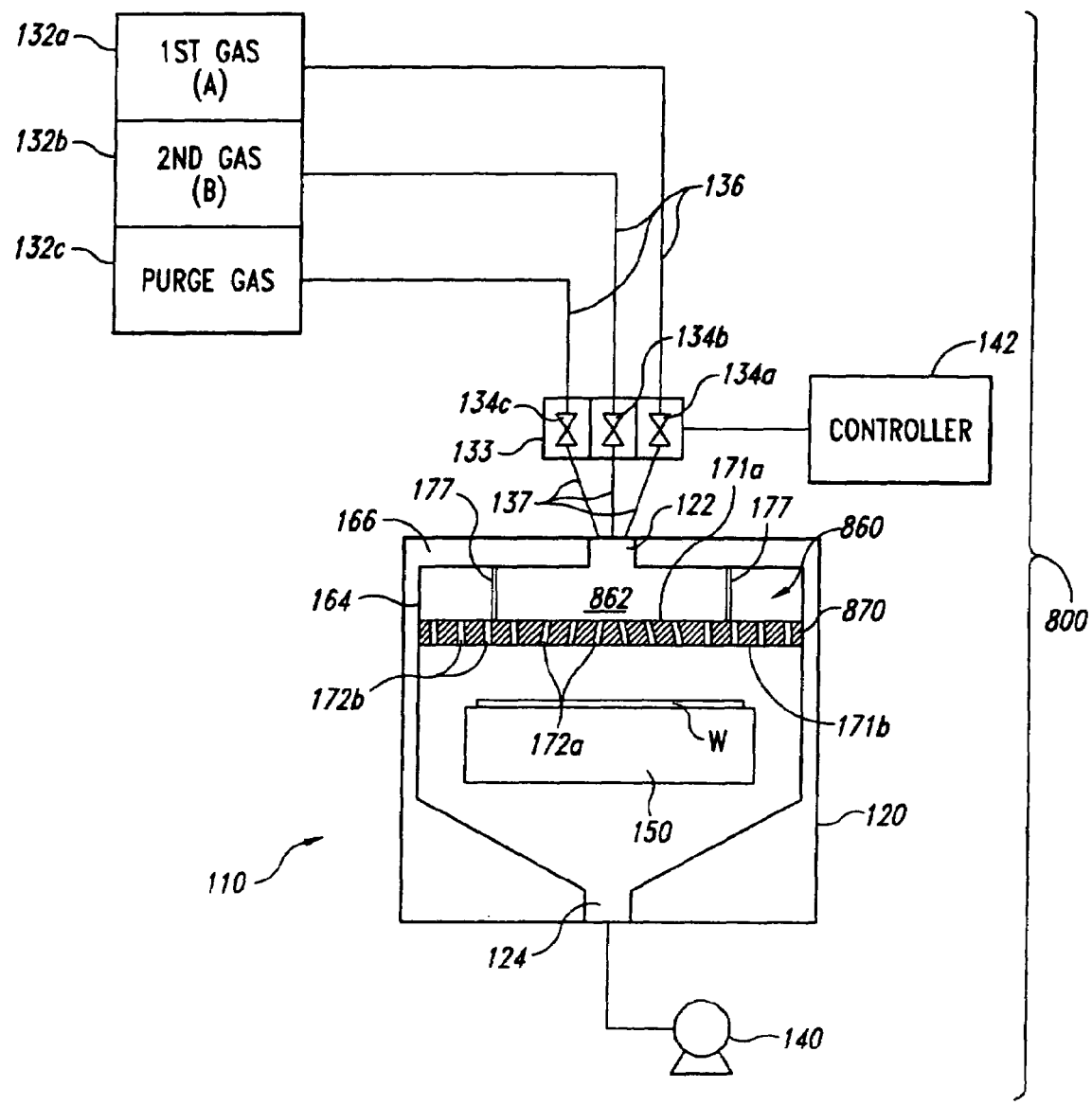
FIG. 8 is a schematic representation of a system including a reactor for depositing a material onto a micro-device workpiece in accordance with another embodiment of the invention.

FIG. 8 is a schematic illustration of another embodiment of a system 800 for depositing a material onto a microelectronic workpiece. The system 800 is similar to the system 100, and thus like reference numbers refer to like components in FIGS. 4 and 8. The difference between the system 800 and the system 100 is that the system 800 includes a gas distributor 860 with a distributor plate 870 that extends to the sidewall 164 to eliminate the gap 180 shown in FIG. 4. It will be appreciated that the distributor plate 870 can include any of the distributor plates explained above with reference to FIGS. 4-7. Therefore, other aspects of the invention include a completely enclosed compartment or plenum 862.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A reactor for vapor deposition of a material onto a microelectronic workpiece having an inner region and an outer region radially outward from the inner region, comprising:
   a reaction chamber having an inlet and an outlet; and
   a gas distributor in the reaction chamber, the gas distributor having a plenum through which a gas can flow along a flow path, the plenum having a distributor plate transverse to the flow path, and the distributor plate having a plurality of passageways extending through the plate, the passageways including first passageways having a first physical parameter and extending through the plate at an oblique angle relative to a plane defined by the plate and second passageways having a second physical parameter different than the first physical parameter and extending through the plate at an angle substantially perpendicular to the plane, and wherein the first passageways are in an inner region of the plate to supply the gas to the inner region of the microelectronic workpiece and the second passageways are in an outer region of the plate to supply the gas to the outer region of the microelectronic workpiece.

2. The reactor of claim 1 wherein:
   the plenum comprises a sidewall; and
   the distributor plate has a peripheral edge spaced laterally inward from the sidewall to define a gap between the peripheral edge and the sidewall.

3. The reactor of claim 2 wherein the first passageways are canted at an angle of approximately 15° to approximately 85° relative to the plane defined by the distributor plate.

4. The reactor of claim 2 wherein the first passageways in the inner region have a cross-sectional dimension of approximately 0.01-0.07 inch, and the second passageways in the outer region have a cross-sectional dimension of approximately 0.08-0.20 inch.

5. The reactor of claim 1 wherein:
   the plenum comprises a sidewall; and
   the distributor plate has a peripheral edge coupled to the sidewall.

6. A reactor for vapor deposition of a material onto a microelectronic workpiece having an inner region and an outer region radially outward from the inner region, comprising:
   a reaction chamber having an inlet and an outlet; and
   a gas distributor in the reaction chamber that is coupled to the inlet, the gas distributor comprising a plenum having a single compartment through which a gas can flow and a distributor plate, the distributor plate having a first surface facing the compartment, a second surface facing away from the compartment, and a plurality of passageways extending from the first surface to the second surface, wherein the passageways include first passageways located at a central portion of the distributor plate to supply the gas to the inner region of the microelectronic workpiece, the first passageways extending at an oblique angle relative to the first surface of the distributor plate, and wherein the passageways also includes second passageways located in an outer region of the distributor plate to supply the gas to the outer region of the microelectronic workpiece, the second passageways having a physical characteristic different from the first passageways and extending through the plate at an angle substantially perpendicular to the first surface of the distributor plate.

7. The reactor of claim 6 wherein:
the compartment comprises a sidewall; and
the distributor plate has a peripheral edge spaced laterally inward from the sidewall to define a gap between the peripheral edge and the sidewall.

8. The reactor of claim 7 wherein the first passageways are canted at an angle of approximately 15° to approximately 85° relative to the first surface of the distributor plate.

9. The reactor of claim 7 wherein the first passageways in the central portion have openings of approximately 0.01-0.07 inch and the second passageways in the outer region have openings of approximately 0.08-0.20 inch.

10. The reactor of claim 6 wherein:
the compartment comprises a sidewall; and
the distributor plate has a peripheral edge coupled to the sidewall.

11. A reactor for vapor deposition of a material onto a microelectronic workpiece having an inner region and an outer region radially outward from the inner region, comprising:
a reaction chamber having an inlet and an outlet; and
a gas distributor in the reaction chamber, the gas distributor having a plenum through which a gas can flow along a flow path, the plenum having a distributor plate transverse to the flow path, and the distributor plate having a plurality of passageways extending through the plate, the passageways including first passageways extending through the plate at an oblique angle relative to a plane defined by the plate to supply the gas to the inner region of the microelectronic workpiece, and second passageways extending through the plate at an angle substantially perpendicular to the plane to supply the gas to the outer region of the microelectronic workpiece, and wherein the first passageways are in an inner region of the plate and the second passageways are in an outer region of the plate.

12. The reactor of claim 11 wherein:
the plenum comprises a sidewall; and
the distributor plate has a peripheral edge spaced laterally inward from the sidewall to define a gap between the peripheral edge and the sidewall.

13. The reactor of claim 11 wherein the first passageways have a first cross-sectional dimension and the second passageways have a second cross-sectional dimension different than the first cross-sectional dimension.

14. The reactor of claim 11 wherein the first passageways are canted at an angle of approximately 15° to approximately 85° relative to the plane defined by the distributor plate.

15. The reactor of claim 11 wherein the first passageways in the inner region have a cross-sectional dimension of approximately 0.01-0.07 inch, and the second passageways in the outer region have a cross-sectional dimension of approximately 0.08-0.20 inch.

16. The reactor of claim 11 wherein:
the plenum comprises a sidewall; and
the distributor plate has a peripheral edge coupled to the sidewall.

* * * * *